United States Patent
Pompei et al.

(10) Patent No.: US 10,165,710 B1
(45) Date of Patent: Dec. 25, 2018

(54) COOLING SYSTEM FOR DATA CENTER

(71) Applicant: Amazon Technologies, Inc., Reno, NV (US)

(72) Inventors: Giorgio Arturo Pompei, Seattle, WA (US); Brock Robert Gardner, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 407 days.

(21) Appl. No.: 14/317,842

(22) Filed: Jun. 27, 2014

(51) Int. Cl.
*H05K 7/20* (2006.01)

(52) U.S. Cl.
CPC .................. *H05K 7/20745* (2013.01)

(58) Field of Classification Search
CPC ............ H05K 7/20745; H05K 7/1485; H05K 7/1497; H05K 7/20709; H05K 7/20136; H05K 5/00
USPC ... 361/695, 796, 679.53, 689, 699, 700, 702
See application file for complete search history.

(56) References Cited

U.S. PATENT DOCUMENTS

| | | | |
|---|---|---|---|
| 2002/0055329 A1* | 5/2002 | Storck, Jr. | F24F 7/06 454/186 |
| 2007/0091570 A1* | 4/2007 | Campbell | G06F 1/20 361/699 |
| 2008/0055846 A1* | 3/2008 | Clidaras | G06F 1/20 361/679.41 |
| 2008/0180908 A1* | 7/2008 | Wexler | H05K 7/20745 361/690 |
| 2008/0204999 A1* | 8/2008 | Clidaras | H05K 7/20745 361/696 |
| 2010/0048121 A1* | 2/2010 | Klopfenstein | F24F 7/10 454/186 |
| 2011/0303406 A1* | 12/2011 | Takeda | H05K 7/20745 165/288 |
| 2012/0174612 A1* | 7/2012 | Madara | F24F 3/147 62/259.2 |
| 2013/0005235 A1* | 1/2013 | Ootani | F24F 11/0001 454/184 |
| 2013/0025888 A1* | 1/2013 | Eckholm | A62C 3/16 169/46 |
| 2013/0050923 A1* | 2/2013 | Wei | H05K 7/20745 361/679.5 |
| 2013/0098597 A1* | 4/2013 | Fujimoto | H05K 7/20745 165/287 |
| 2013/0283837 A1* | 10/2013 | Takahashi | F24F 1/022 62/238.6 |

(Continued)

FOREIGN PATENT DOCUMENTS

WO    WO 2008014578 A1 *  2/2008 ......... H05K 7/20745

OTHER PUBLICATIONS

Souza Carlos Wagner, "System of Cooling for Data Center and Similar", Feb. 7, 2008, Entire Document (Translation of WO 2008014578).*

*Primary Examiner* — Jerry Wu
*Assistant Examiner* — Stephen Sul
(74) *Attorney, Agent, or Firm* — Baker & Hostetler LLP

(57) ABSTRACT

A data center can include at least one computing room, and at least one rack system disposed in the computing room. The rack system includes a plurality of racks each having a rack housing and a plurality of computing devices mounted to the rack housing. The data center can further include a cooling system that includes a modular air distribution duct configured to direct cold air to different ones of the racks.

19 Claims, 9 Drawing Sheets

(56) References Cited

U.S. PATENT DOCUMENTS

| | | | |
|---|---|---|---|
| 2014/0038510 A1* | 2/2014 | Bailey | H05K 7/20745 |
| | | | 454/339 |
| 2014/0298839 A1* | 10/2014 | Nagamatsu | H05K 7/20745 |
| | | | 62/186 |
| 2015/0056908 A1* | 2/2015 | Chapel | H05K 7/20736 |
| | | | 454/184 |
| 2015/0230364 A1* | 8/2015 | Wands | H05K 7/20145 |
| | | | 454/184 |
| 2016/0040904 A1* | 2/2016 | Zhou | F24F 13/18 |
| | | | 700/276 |

* cited by examiner

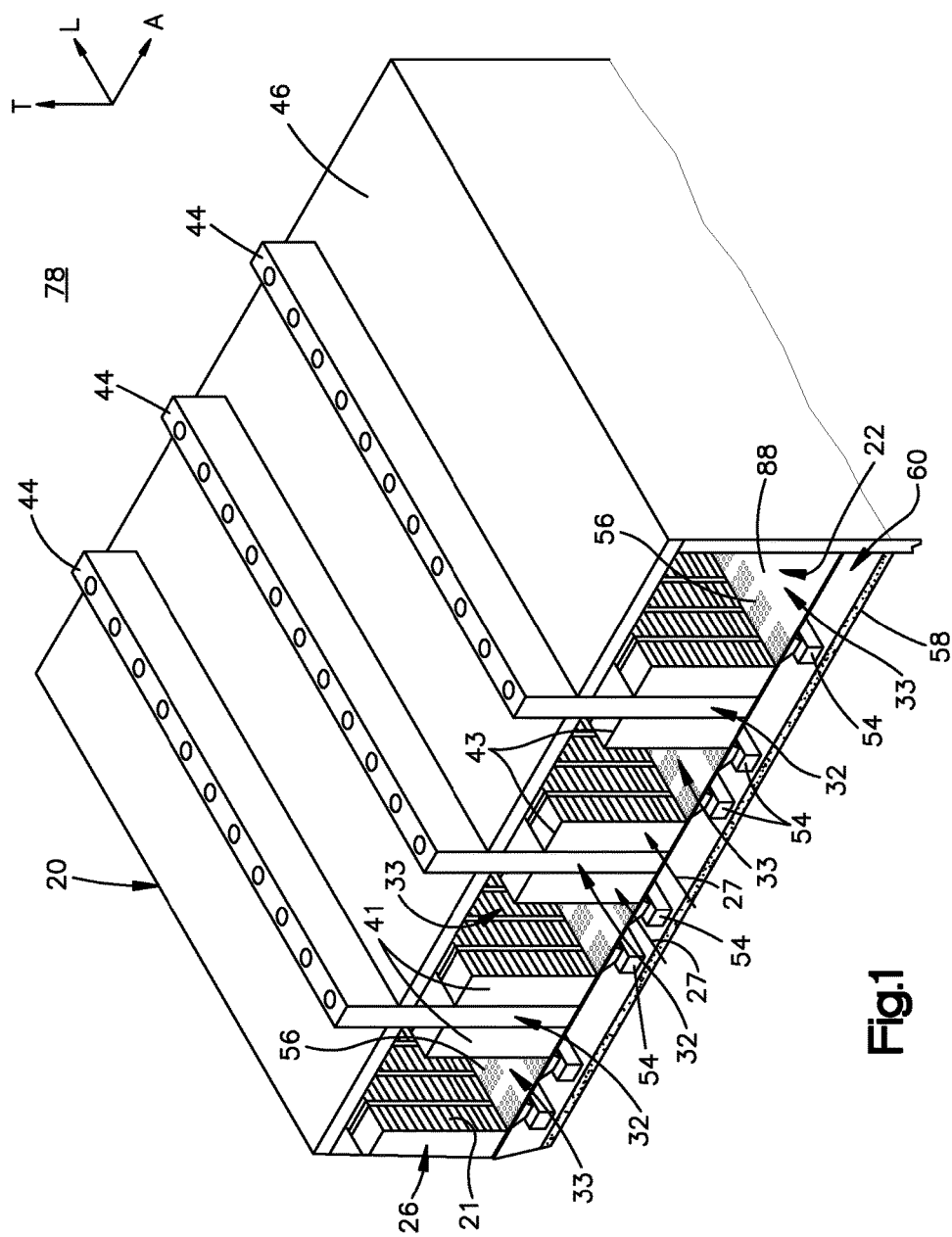

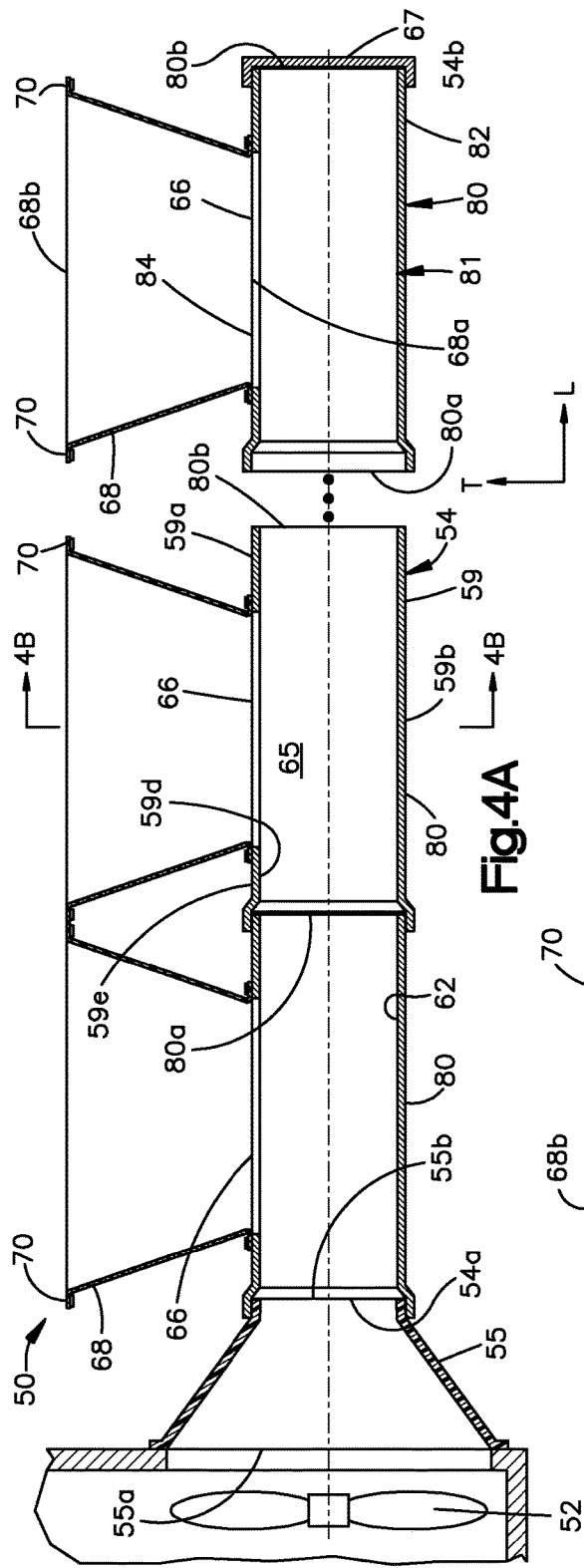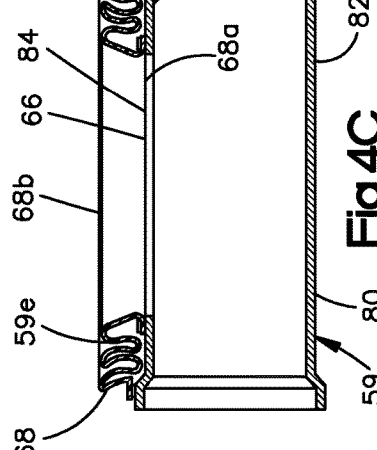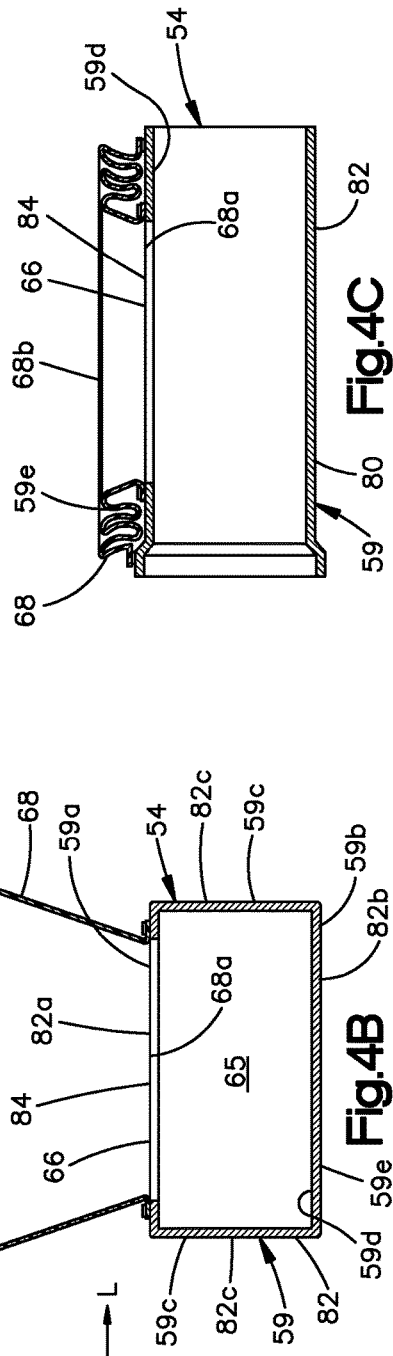

COOLING SYSTEM FOR DATA CENTER

BACKGROUND

Computing-intensive or data-intensive organizations such as on-line retailers, Internet service providers, search providers, financial institutions, and the like often conduct computer operations from large scale computing facilities, known as data centers. Such computing facilities house and accommodate a large number of server, network, and other computer equipment suitable to process, store, and exchange data as desired to facilitate the organization's operations. Data centers can be located local to the organization or remote from the organization, such that data can be exchanged to and from the data center over a hard wire, over the internet, or a combination of the two. Typically, a computer room of a data center includes many racks that each includes a rack housing that supports a plurality of brackets that are spaced from one another so as to define a corresponding plurality of mounting slots, otherwise known as bays. The racks are configured to support a respective plurality of servers that are rack-mounted to the rack housing in the bays so as to define a rack system.

Data centers typically include a number of components that generate a significant amount of waste heat during operation. Such components include printed circuit boards, mass data storage devices, power supplies, and processors. For example, some computers with multiple processors can generate 250 watts of waste heat. For example, a standard 19-inch rack may hold ten to twenty servers of various heights of 1 U, 2 U, and 3 U (wherein "U" designates a rack unit of 1.75 inches). Some conventional rack systems can include up to forty or more such rack-mounted components, and such rack systems can generate as much as 10 kilowatts of waste heat. It is thus recognized that removal of waste heat is a significant challenge in the day-to-day management of data centers.

One conventional attempt to thermally regulate rack systems includes the division of the data center room into hot air aisles and cold air aisles. Cold air is fed into the cold air aisle, such that internal fans of the individual servers draw the cold air from the cold air aisle so that the cold air flows around various server components, and expel heated air into the hot air aisle. It should thus be appreciated that the racks are open to both the cold air aisles and the warm air aisles. Conventional air cooling systems often require large amounts of energy to cool the air that is delivered to the cold air aisle, and are thus inefficient.

BRIEF DESCRIPTION OF THE DRAWINGS

The following detailed description will be better understood when read in conjunction with the appended drawings, in which there is shown in the drawings example embodiments for the purposes of illustration. It should be understood, however, that the present disclosure is not limited to the precise arrangements and instrumentalities shown. In the drawings:

FIG. 1 is a schematic partial perspective view of a data center including a computing room, a plurality of rack systems disposed in the computing room and open to respective cold air aisles and hot air aisles, and a cooling system configured to deliver cold air to the cold air aisles, the cooling system including at least one air mover and a plurality of air distribution ducts;

FIG. 4A is an exploded side elevation view of one of the air distribution ducts illustrated in FIG. 1, including a plurality of air distribution duct modules;

FIG. 4B is a sectional end elevation view of the air distribution duct illustrated in FIG. 4A, taken along line 4B-4B, and shown in an expanded configuration;

FIG. 4C is a sectional end elevation view of the air distribution duct illustrated in FIG. 4A, but shown in a collapsed configuration.

DETAILED DESCRIPTION

Figure 2A:
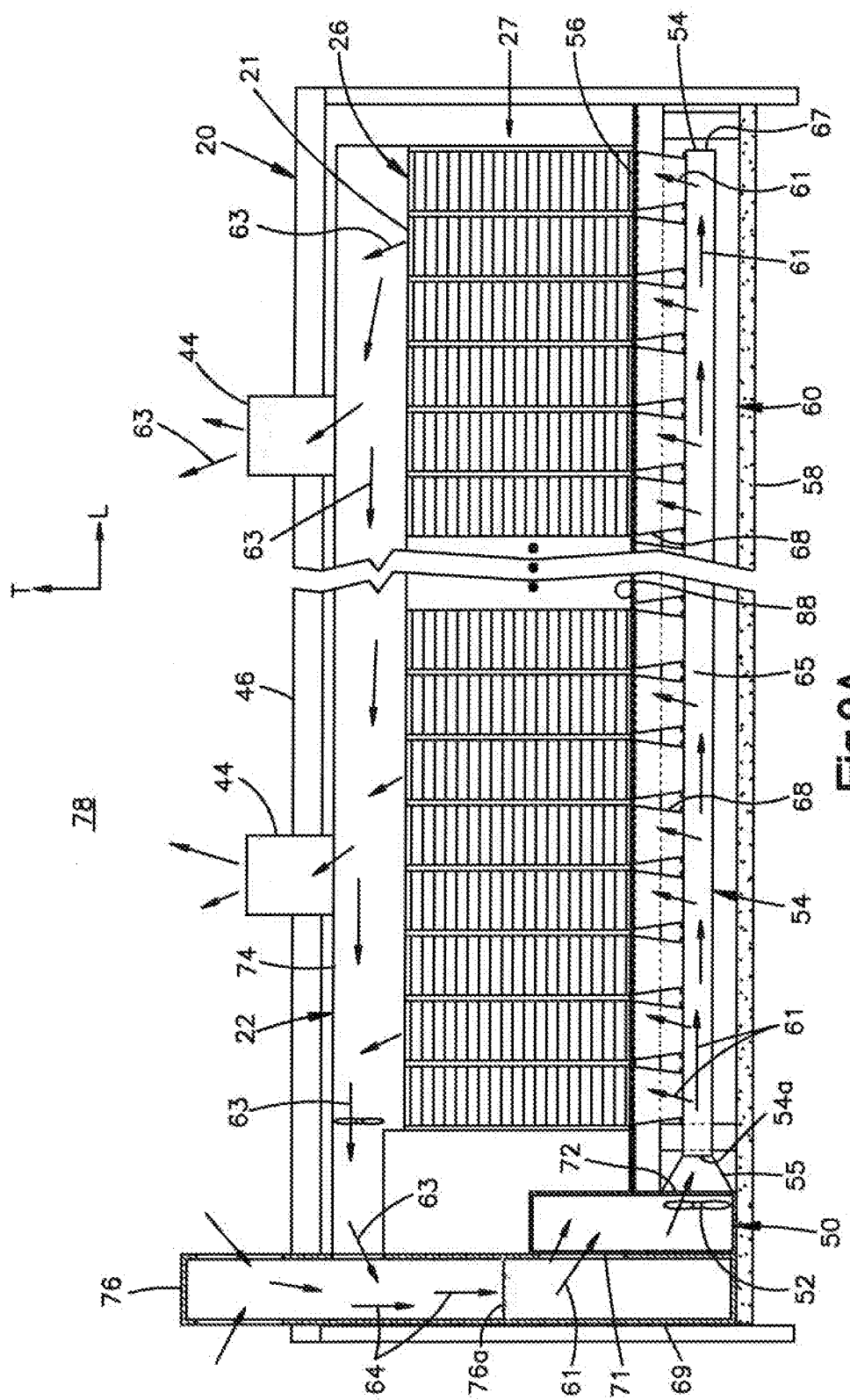
FIG. 2A is a sectional side elevation view of the data center illustrated in FIG. 1, showing airflow from the cooling system into the cold air aisles.

Systems and methods in accordance with various embodiments of the present disclosure provide the ability to remove heat from racks of computing devices of a data center. For example, in one embodiment, the data center includes an air distribution duct having outlets that are aligned with respective intakes of the computing devices.

According to one embodiment, the system can include conventional computing devices that do not require modification in order to facilitate removal of heat from the rack mounted computing devices.

Further still, according to one embodiment, the system does not occupy rack space that can otherwise be reserved for rack mounted computing devices.

As used herein, "data center" includes any facility or portion of a facility in which computer operations are carried out. A data center may include computing devices, including servers, dedicated to specific functions or serving multiple functions. Examples of computer operations include information processing, communications, testing, simulations, power distribution and control, and operational control.

As used herein, "computing room" refers to a room in a data center in which at least one rack resides. The room can be fully or partially defined by at least one computing room wall in the data center, or can be defined by an open space in a data center. The computing room wall can be disposed within the data center, or can be defined by an exterior wall of the data center.

As used herein, "cold air aisle" refers to a space in the data center that contains air to be passed through the computing devices such that heat from various components of the computing devices is transferred to the air that has been passed therethrough;

As used herein, "hot air aisle" refers to a space in the data center that receives air that is exhausted from the computing devices;

As used herein, "rack housing" refers to a housing that at least partially defines an interior space within which at least one rack resides.

As used herein, "rack" means a rack, container, frame, bracket, plurality of brackets, or any other element or combination of elements that can contain or physically support one or more computing devices.

As used herein, "computing device" includes any of various devices in which computing operation or data storage can be performed. One example of a computing device is a rack-mounted server. As used herein, the term computing device is not limited to just those circuits referred to in the art as a computer, but broadly refers to a processor, a server, a microcontroller, a microcomputer, a programmable logic controller (PLC), an application specific circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In the various embodiments, memory may include, but is not limited to, a computer-readable medium, such as a random access memory (RAM). Alternatively or additionally, memory may include a compact disc-read only memory (CD-ROM), a magneto-optical disk (MOD), and/or a digital versatile disc (DVD). Also, additional input channels may include computer peripherals associated with an operator interface such as a mouse and a keyboard. Alternatively, other computer peripherals may also be used that may include, for example, a scanner. Further, in some embodiments, additional output channels may include an operator interface monitor and/or a printer.

As used herein, "duct" includes any tube, pipe, conduit, or combination thereof, that has one or more passageways through which a fluid can be conveyed. Examples of materials for a duct include cloth, fabric, metal (for instance extruded metal or sheet metal), a polymer, or a combination thereof. A passageway of a duct may have any size and shape. The cross-section of a duct may be rectangular, square, round, ovate, or any other regular or irregular shape. A passageway of a duct may have a constant or changing cross section or a cross section that changes over the length of the passageway.

Referring to FIGS. 1-3A, a data center 20 can include one or more computing rooms, such as a computing room 22, and a plurality of rack systems 26 that are disposed in the computing room 22. Each of the rack systems 26 cam be arranged in a respective row 27, such that the data center includes a plurality of rows 27 of rack systems 26 disposed in the computing room 22. The rows can be elongate along a longitudinal direction L. At least some up to all of the rack systems 26 can include at least one rack 21 such as a plurality of racks 21 that each includes a rack housing 28 that supports a plurality of brackets. At least some up to all of the rack systems 26 can further include at least one computing device 34 such as a plurality of computing devices 34 supported by the brackets in the one or more rack housings 28. Thus, it can be said that the computing devices 34 are supported by the rack housing 28. The brackets, and thus the plurality of computing devices 34, of a respective one of the racks 21 can be spaced from each other along a transverse direction T that is perpendicular, or otherwise angularly offset, with respect to the longitudinal direction L.

Each of the rows 27 of rack systems 26 can be disposed between a hot air aisle 32 and a cold air aisle 33. The hot air aisles 32 and the cold air aisles 33 can be spaced from each other along a lateral direction that is substantially perpendicular or otherwise angularly offset with respect to the longitudinal direction L and the transverse direction T. Thus, it should be appreciated that the data center 20 can include a plurality of hot air aisles 32 and a plurality of cold air aisles 33. Furthermore, the data center 20 can include a plurality of rows 27 of rack systems 26 that are spaced from each other such that each of the plurality of rows 27 of rack systems 26 is disposed between a respective one of a plurality of hot air aisles 32 and a respective one of a plurality of cold air aisles 33. The rows 27 of rack systems 26 can be arranged so as to define at least one pair 41 of adjacent rows 27 of rack systems 26. For instance, the rows 27 of rack systems 26 can include at least one pair 41 of rows 27 of rack systems 26. The computing devices 34 of the pair 41 of rows 27 of rack systems 26 can share a common one of the plurality of hot air aisles 32, such that the hot air is exhausted from each of the rack systems 26 of the pair 41 into the common one of the hot air aisles 32. Thus, in accordance with one embodiment, the respective computing devices 34 of each of the rack systems 26 of the pair 41 can exhaust the hot air into the common one of the hot air aisles 32. Furthermore, the rows 27 of rack systems 26 can include at least one pair 43 of rows 27 of rack systems 26 whose computing devices 34 share a common one of the plurality of cold air aisles 33, such that the respective computing devices 34 of each of the rack systems 26 of the pair 43 receive cold air from the common one of the plurality of cold air aisles 33. In accordance with the illustrated embodiment, the rows 27 of the at least one pair 43 can be defined by one row 27 of a first one of the pairs 41 and one row 27 of a second one of the pairs 41. Otherwise stated, the at least one pair 41 of rows 27 of rack systems 26 can be defined by one row 27 of a first one of the pairs 43 and one row 27 of a second one of the pairs 43. It should be appreciated that the air inside the cold air aisle 33 has a temperature that is less than the temperature of the air in the hot air aisle 32 during operation of the computing devices 34.

Figure 2B:
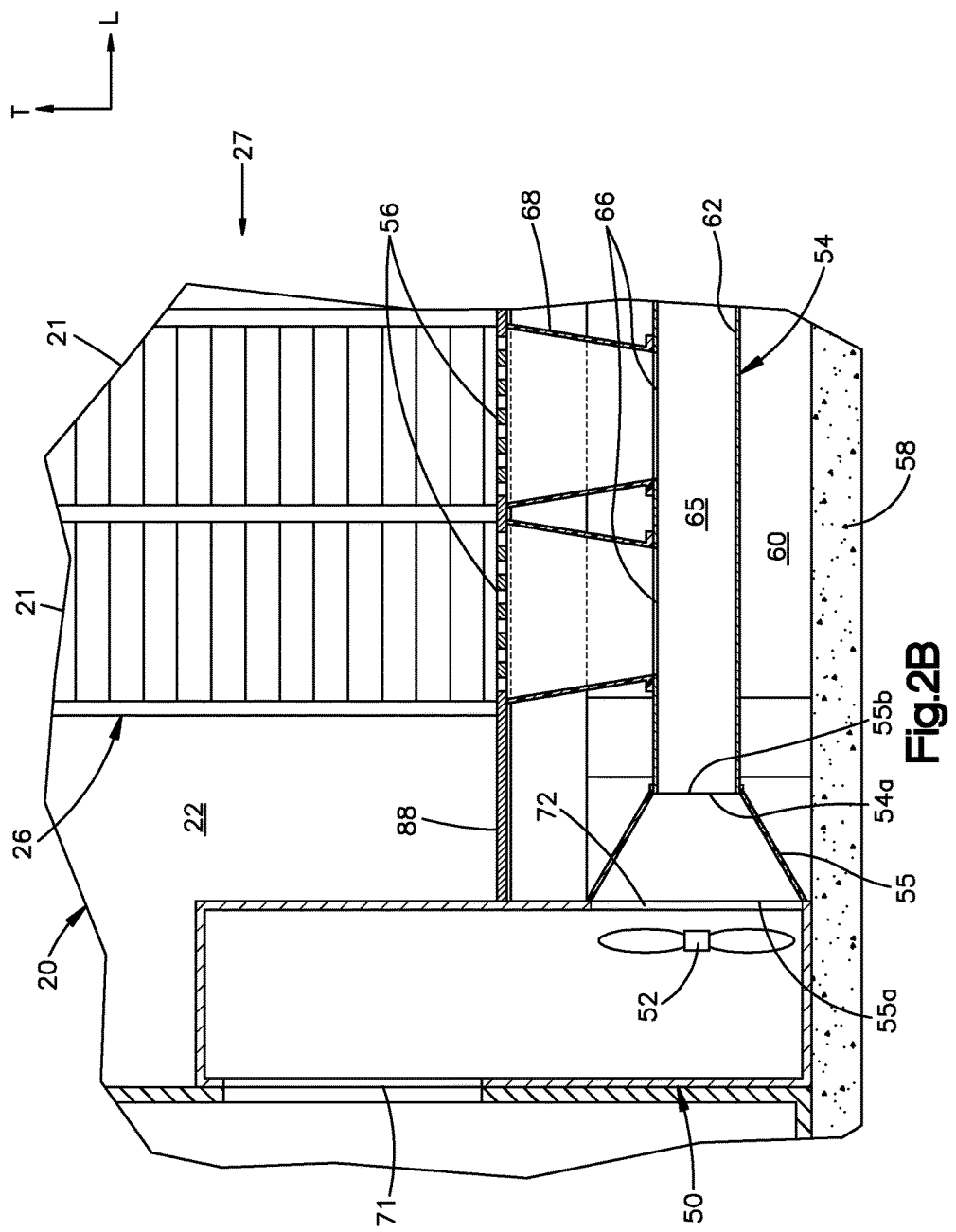
FIG. 2B is an enlarged schematic sectional side elevation view of a portion of the data center illustrated in FIG. 2A.
Figure 3B:
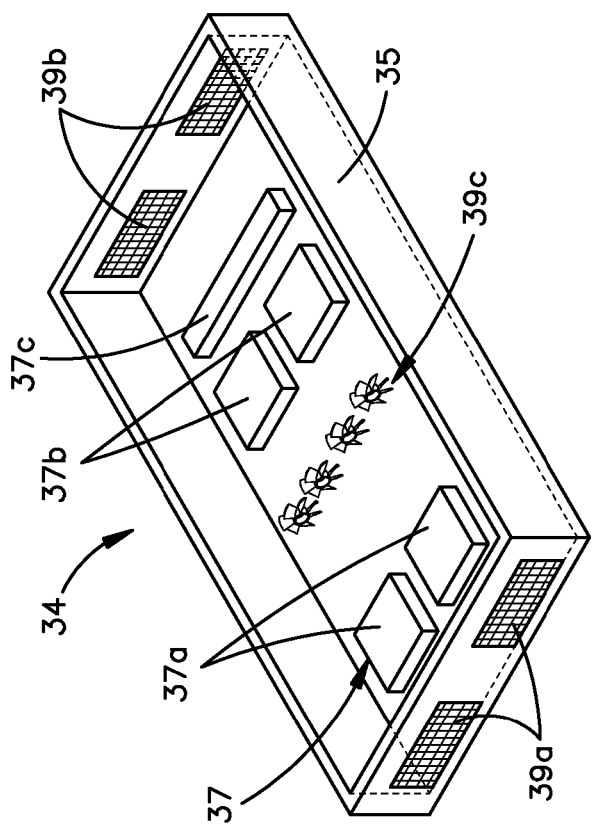
FIG. 3B is a schematic perspective view of one of the computing devices mounted to the rack as illustrated in FIG. 3A, with portions removed to illustrate various computing device components.
Figure 3A:
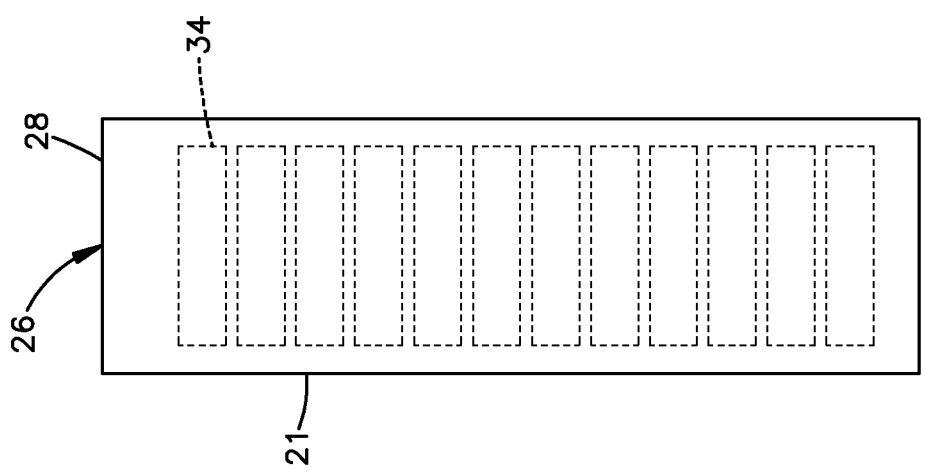
FIG. 3A is a front elevation view of one of the rack systems illustrated in FIG. 1 including a rack housing that defines an interior space, and a plurality of computing devices mounted to the rack.

Referring now to FIGS. 2B and 3B, each of the computing devices 34 can include an outer housing 35 that contains a plurality of electrical components 37 of the computing device 34. For instance, electrical components 37 can include one or more hard drives 37a, processors 37b, and memory modules 37c. Each of the electrical components 37 can produce heat during operation of the computing device 34. The computing devices 34 can further include at least one air intake 39a that can be configured as a vent that extends through the housing 35, at least one air outlet 39b that can be configured as a vent that extends through the housing 35, and at least one fan such as a plurality of fans 39c that are configured to produce a negative pressure that draws cold air 61 from a respective one of the cold air aisles 33 to pass into the air intake 39a, through the computing devices 34, and out the air outlets 39b. As the cold air 61 is received by the computing devices 34 and passes through the computing devices 34, heat is transferred to the drawn cold air 61 to produce hot air 63, which is exhausted through the air outlets 39b into a respective one of the hot air aisles 32. For instance, the received cold air 61 can flow over the electrical components 37 so as to transfer heat from the electrical components 37 to the received cold air 61, and the computing devices can exhaust the hot air out of the housing 35. At least a portion up to an entirety of the hot air 63 in the hot air aisles 32 can then be expelled from the data center 20. For instance the hot air aisles 32 can define chimneys 44 that extend out from a roof 46 of the data center 20, as illustrated in FIG. 1. As will be described in more detail below, a portion of the hot air can be directed to an air mover for recirculation into the computing room. It should be appreciated that the computing devices 34 can be configured to draw the cold air 61 into the respective housing 35. Alternatively or additionally, the cold air 61 can be forced into the housing 35 without operating fans inside the housing 35 to induce a negative pressure within the housing 35. For instance, the cold air 61 in the cold air aisles 33 can be placed under a positive pressure that causes the cold air 61 to be drawn into the respective housings 35 of the computing devices 34, and pass through the computing devices 34.

Figure 2C:
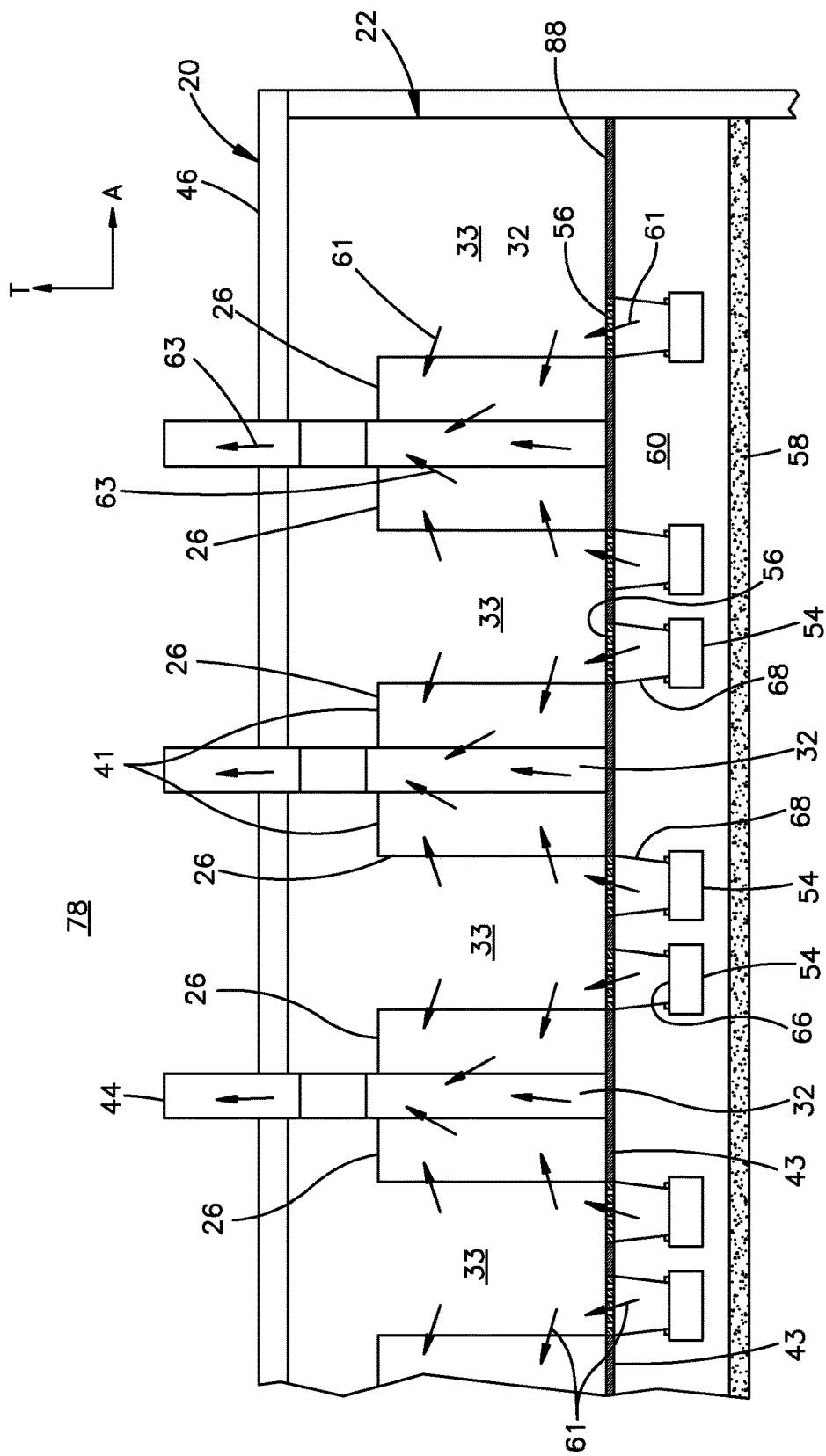
FIG. 2C is an enlarged schematic sectional end elevation view of a portion of the data center illustrated in FIG. 1.

With continuing reference to FIGS. 1-2C, the data center 20 further includes a cooling system 50 that is configured to deliver cold air 61 to the cold air aisles 33. The cooling system 50 can include at least one air mover 52, at least one air distribution duct 54 coupled to the at least one air mover 52, and a header 55 that is connected between the at least one air mover 52 and the at least one air distribution duct 54. For instance, the cooling system 50 can include a plurality of air movers 52, and a plurality of air distribution ducts 54. Each of the air distribution ducts can be coupled to a respective different one of the air movers 52. Alternatively, as is described in more detail below, more than one of the air distribution ducts 54 can be coupled to a common one of the air movers as desired. The air movers 52 are configured to induce a pressure that directs cold air 61 through the at least one air distribution duct 54.

The data center 20 includes a floor 88 disposed in the computing room 22 between the plurality of cold air aisles 33 and the air distribution ducts 54. The rack systems 26 can be supported by the floor 88. At least a portion of the floor 88 can porous as desired. The data center 20 can further include a base 58 that is disposed below the floor 88, so as to define a void 60 between the base 58 and the floor 88. The air distribution ducts 54 can be disposed in the void 60 between base 58 and the floor 88, such that cold air output from the air distribution ducts 54 travels through the floor 88 and into the intakes 39a of the operatively aligned at least one rack 21. Thus, at least a portion of the floor 88 can be porous. For instance, the floor 88 can include at least one porous vent 56 in operative alignment with the intakes 39a of a respective one of the racks 21. Each of the vents 56 can define a first side 56a that faces the computing room 22, and in particular a respective one of the cold air aisles 33, and a second side 56b opposite the first side. The vents 56 can define perforations that extend therethrough from the first side 56a to the second side 56b. The porous vent 56 can be aligned with a cold air aisle 33 along the transverse direction T, and offset from the air intakes 39a of a respective one of the racks 21 in the lateral direction A toward the lateral center of the cold air aisle 33. The lateral center of the cold air aisle 33 is equidistantly spaced from the rows 27 of rack systems 26 of the pair 43 whose computing devices 34 share the cold air aisle 33. Further, the porous vent 56 can be offset a first distance from the air intakes 39a of operatively aligned racks 21 along the lateral direction A, and the lateral center of the cold air aisle 33 can be offset a second distance from the air intakes 39a along the lateral direction A that is greater than the first distance.

In one example, the floor 88 can include a plurality of porous floor vents 56 in operative alignment with the air intakes 39a of respective ones of the racks 21. Thus, the floor vents 56 operatively aligned with one of the rows 27 can be spaced from each other along the longitudinal direction L. Each of the racks 21 can be disposed adjacent a respective one of the floor vents 56 along the lateral direction A. It should be appreciated that the floor vents 56 can define any size and shape as desired. For instance, one or more of the floor vents 56 can be elongate so as to be offset with respect to more than one rack 21 in the lateral direction A along a row of rack systems 26. Accordingly, one or more of the floor vents 56 can be in operative alignment with the air intakes 39a of a plurality of racks 21. Thus, it can be said that the floor 88 can include at least one porous vent 56 in operative alignment with at least one of the intakes 39a of a respective one of the racks 21. Accordingly, cold air that flows through the porous vent 56, and thus through the floor 88, can be directed to the air intakes 39a of the respective operatively aligned at least one of the racks 21. The racks 21 can be included in a common one of the rows 27. Thus, the cooling system 50 is configured to direct air into respective aligned ones of the cold air aisles 33 toward the respective intakes 39a of the operatively aligned racks 21, without directing air from the ducts 54 to the lateral center of the cold air aisles 33.

Each duct 54 can be elongate from a first end 54a to a second end 54b along its length. The second end 54b can be spaced from the first end 54a along the longitudinal direction L. Each duct 54 can further define at least one surface 62 which can, in turn, define a passageway 65 that extends from the first end 54a toward the second end 54b. For instance, the duct 54 can include a body 59 having a top 59a, a bottom 59b opposite the top 59a, and first and second opposed sides 59c that extend from the top 59a to the bottom 59b. The at least one surface 62 can be defined by one or more up to all of the top 59a, a bottom 59b opposite the top 59a, and first and second opposed sides 59c. For instance, the body 59 can define an inner surface 59d and an outer surface 59e opposite the inner surface 59d. The inner surface 59d can define the at least one surface 62 that defines the passageway 65. The top 59a, bottom 59b, and sides 59c can combine to define a rectangular cross-section of the duct 54, or can define any suitable cross-sectional shape as desired, including but not limited to triangular, square, circular, elliptical, or any alternative regular or irregular geometry as desired. The first end 54a of the duct 54 can be open so as to receive source air, and the second end 54b of the duct 54 can be closed. For instance, the duct 54 can define an end wall 67 at the second end 54b that closes the passageway 65 at the second end 54b. The passageway 65 can thus be open to the first end 54a and closed at the second end 54b. The passageway 65 can define a dimension along the lateral direction A and the transverse direction T as desired, for instance within the range of twelve inches and thirty-six inches, including approximately twenty-four inches.

The duct 54 can define a plurality of duct outlets 66 that extend through a portion of the body 59 from the outer surface 59e to the inner surface 59d, such that the duct outlets 66 are open to the passageway 65. In one embodiment, at least a portion of the top 59a of the body 59 faces the floor 88, and the duct outlets 66 can extend through the top 59a. It should be appreciated, of course, that the duct outlets 66 can alternatively extend through any other suitable location of the body 59 such that air can travel through the passageway 65, out the duct outlets 66, and into the cold air aisle 33 as desired. For instance, each of the ducts 54 can define a plurality of connectors 68 that extend out from the body 59 of the duct 54, and are configured to place the duct outlets 66 in fluid communication with the floor 88. The duct outlets 66 can be substantially equidistantly spaced from each other along the length of the duct 54 between the first end 54a and the second end 54b, or can be variably spaced from each other as desired.

The connectors 68 can each define a first end 68a that surrounds respective ones of the duct outlets 66, and a second end 68b opposite the first end 68a. The first ends 68a can be removable from the duct body 59 as desired. The second ends 68b are configured to be supported by the floor 88, such that the second end 68b is in fluid communication with the cold air aisle 33, and thus in fluid communication with the computing room 22. Accordingly, the second ends 68b can be aligned with porous regions of the floor 88. As will be appreciated from the description below, the second ends 68b of the connectors 68 of a respective one of the ducts 54 can be in operative alignment with respective different ones of the racks 21. In one example, the second end 68b can surround at least one of the floor vents 56. Alternatively, the vent 56 can be sized greater than the second end 68b of the connector 68, such that the second end 68b is in fluid communication with the cold air aisle. A remainder of the floor 88 can be solid and nonporous with respect to airflow, or can be porous as desired. Alternatively still, a substantial entirety of the floor 88 can be porous as desired. It be appreciated that the second end 68b is configured to be mounted to the floor 88 at a location offset from the air intakes 39a of the operatively aligned at least one rack 21 in the lateral direction A a first distance, such that the lateral center of the cold air aisle 33 is spaced from the air intakes 39a a second distance along the lateral direction A that is greater than the first distance. The second end 68b of the connector 68 can define a dimension along the lateral direction A and the longitudinal direction L as desired, for instance within the range of twelve inches and thirty-six inches, including approximately twenty-four inches.

It should be appreciated that the computing room 22 is partially defined by a first side of the floor 88, and the connectors 68 are supported by a second side of the floor 88 opposite the first side of the floor 88. The vents 56 can place the first side of the floor 88 in fluid communication with the second side of the floor 88. Accordingly, when the second end 68b is attached to the second side of the floor 88, the connector 68 places the passageway 65 of the duct 54 in fluid communication with the cold air aisle 33 of the computing room 22. In one embodiment, first and second ducts 54 can be configured to exhaust cold air into a common one of the cold air aisles so as to direct cold air to first and second ones of the rack systems 26 of the pair 43 of rack systems 26 that are spaced from each other by one of the cold air aisles 33. The first duct 54 can be operatively aligned with the first rack system 26 of the pair 43, and the second duct 54 can be operatively aligned with the second rack system 26 of the pair 43. Thus, the lateral center of the cold air aisle 33 can be disposed between the second ends 68b of the connectors 68 of the first and second ducts 54, respectively, along the lateral direction A.

Referring now to FIGS. 4A-4C, the connectors 68 can be constructed in accordance with any suitable embodiment as desired. In one example, the connectors 68 can be made of a flexible material so as to be expandable away from the outer surface 59e of the body 59, and collapsible toward the outer surface 59d of the body 59. It is also appreciated that the connectors 68 are nonporous with respect to air flow through their walls, with the exception of the first and second ends 68a and 68b. The second end 68b can be mounted to the floor, or to an auxiliary structure supported by the floor 88. For instance, the second end 68b can define any suitable attachment member 70 which can be configured as a plurality of hooks configured to attach to the floor 88. Alternatively or additionally, the attachment members 70 can be magnetic so as to magnetically attach to the floor 88. Alternatively still, the attachment members 70 can be configured as hooks or loops that are configured to attach to respective others of hooks or loops that are supported by the floor 88. Thus, in a first configuration (see FIG. 4C), the connectors 68 can be collapsed against the body 59 of the duct 54 such that the second end 68b is spaced from the passageway 65 a first distance, and in a second configuration (see FIG. 4B), the connectors 68 can be expanded away from the body 59 of the duct 54 such that the second end 68b is spaced from the passageway 65, a second distance greater than the first distance. The second end 68b can be attached to the floor 88 in the second expanded configuration. It is appreciated that the connectors 68 can expand or extend out to a third fully expanded configuration such that the second end 68b is spaced from the passageway 65 a third distance greater than the second distance. Thus, the duct 54 can be spaced from the floor 88 at any suitable location such that the distance between the outer surface 59e is spaced from the floor 88 a distance less than or equal to the third distance.

With continuing reference to FIGS. 4A-4C, and as described above, the cooling system 50 is configured to deliver cold air 61 to the cold air aisles 33. The cooling system 50 can include at least one air mover 52, which can be a fan or any suitable alternative device configured to induce pressure in the passageway 65. The cooling system 50 can further include a header 55 coupled between the air mover 52 and at least one of the air distribution ducts 54, thereby placing the air mover 52 in fluid communication with the passageway 65. The header 55 can define a first end 55a configured to attach to the air mover 52 so as to surround an air mover outlet 72 of the air mover 52. The header 55 can define a second end 55b that is configured to attach to the first end 54a of the duct 54. The header 55 can define a cross-sectional dimension that increases along a direction from the first end 55a to the second end 55b. Further, the header 55 can be made of any suitable flexible material as desired so as to facilitate attachment to both the air mover 52 and the duct 54. Because the connectors 68 are flexible, the duct outlets 66 can be offset with respect to the floor vents 56 in one or both of the lateral direction A and the longitudinal direction L, and the connectors 68 can flex so as to couple to the duct 54 and the floor 88 in the manner described above.

Figure 5:
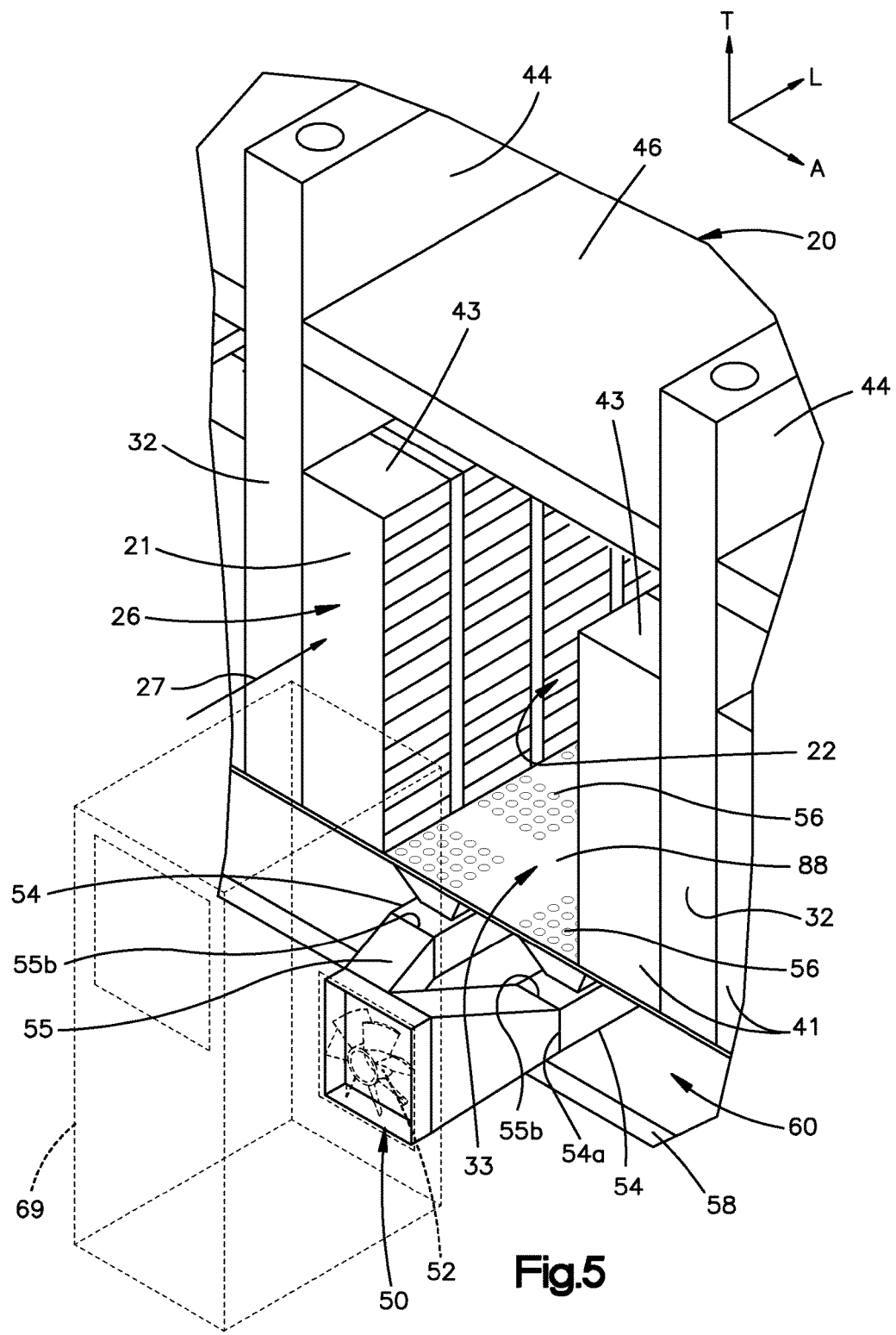
FIG. 5 is a perspective view of a portion of the data center illustrated in FIG. 1, but wherein the cooling system is constructed in accordance with an alternative embodiment.

As illustrated in FIG. 4A, each air mover 52 can be operably coupled to a single row 27 of racks 21. That is, each air mover can direct cold air 61 to travel to the racks 21 of the operably coupled row 27. Alternatively, as illustrated in FIG. 5, at least one of the air movers 52 can be coupled to more than one of the ducts 54 so as to supply cold air 61 to a plurality of ducts 54, including a pair of ducts 54. For instance, the air mover 52 illustrated in FIG. 5 can be coupled to first and second ones of the ducts 54. Accordingly, the air mover 52 can be configured to supply cold air 61 to first and second ones of the rack systems 26. In one example, the first end 55a of the header 55 can be attached to the air mover 52 so as to surround the air mover outlet 72 of the air mover 52 as described above. The header 55 can define a pair of second ends 55b, each in fluid communication with the first end 55a. A first one of the second ends 55b can be coupled to a first one of the ducts 54, and a second one of the second ends 55b can be coupled to a second one of the ducts 54. Thus, the first one of the ducts 54 can deliver cold air 61 to a first one of the rack systems 26 along a first row 27, and the second one of the ducts 54 can deliver cold air 61 to a second one of the rack systems 26 along a second row 27. It should thus be appreciated that the plurality of ducts 54 can be configured to deliver cold air 61 to respective different ones of the rack systems 26 along their respective rows 27. The first and second ones of the rack systems 26 can define a pair 43 of rack systems 26 as described above. That is, the first and second ones of the rack systems 26 can draw cold air 61 from the same cold air aisle 33. Alternatively, the first and second ones of the rack systems 26 can define a pair 41 of rack systems 26 as described above. That is, the first and second ones of the rack systems 26 can expel hot air 63 to the same hot air aisle 32. Alternatively still, a first air mover 52 can be operably coupled to a first portion of a row 27, and a second air mover 52 can be operably coupled to a second portion of the row 27.

With continuing reference to FIG. 4A, each of the air distribution ducts 54 can be modular, and can include a plurality of plurality of removably interconnected air distribution duct modules 80. Each of the modules 80 can be attached to each other and removed from each other as desired. For instance, each of the modules 80 defines a first end 80a and a second end 80b opposite the first end 80a and spaced from the first end 80a along the longitudinal direction L. Each of the modules 80 can include a module body 82 having a top 82a, a bottom 82b opposite the top 82a, and first and second opposed sides 82c that extend from the top 82a to the bottom 82b. Each of the modules 80 can define a channel 81 that extends through the module body 82 from the first end 80a to the second end 80b. Thus, the channel 81 is open to the first end 80a, and closed at the second end 80b. A plurality, such as at least two, of the modules 80 are configured to be attached to each other such that the respective channels 81 combine to define the passageway 65 of the resulting duct 54 that is defined by the modules 80. Further, the tops 82a of the modules 80 combine to define the top 59a of the resulting duct 54, the bottoms 82b of the modules 80 combine to define the bottom 59b of the resulting duct 54, and the sides 82c of the modules 80 combine to define the sides 59c of the resulting duct 54. The body 82 can define an inner surface 83a and an outer surface 83b opposite the inner surface 83a. The inner surfaces 83a of at least two attached ones of the modules 80 can define the inner surface 59d of the duct 54 that defines the at least one surface 62 of the passageway 65. The top 59a, bottom 59b, and sides 59c can combine to define a rectangular cross-section of the duct 54, or can define any suitable cross-sectional shape as desired, including but not limited to triangular, square, circular, elliptical, or any alternative regular or irregular geometry as desired.

For instance, the first ends 80a of the modules 80 are configured to attach to the second ends 80b of the modules 80. Furthermore, the first ends 80a of the modules 80 are configured to attach to the second end 55b of the headers 55. In accordance with one embodiment, the first ends 80a are configured to receive the second ends 80b so as to attach the modules 80 to each other. Alternatively, the second ends 80b can be configured to receive the first ends 80a so as to attach the modules 80 to each other. It should be appreciated, of course, that the modules 80 can be configured to attach to each other in accordance with any suitable embodiment as desired. Similarly, the first ends 80a can be configured to receive the second ends 55b so as to attach the modules 80 to the header 55. Alternatively, the second ends 55b of the headers 55 can be configured to receive the first ends 80a so as to attach the modules 80 to the header 55. It should be appreciated, of course, that the modules 80 can be configured to attach to the headers 55 in accordance with any suitable embodiment as desired. Further, the end wall 67 can be attached to the second ends 80b of the modules 80 so as to close the channel 81 at the second end 80b.

It should be further appreciated that at least some up to all of the modules 80 of the duct 54 can define at least one module outlet 84 that extends through a portion of the module body 82 from an outer surface of the module body 82 to an inner surface of the module body 82 that is opposite the outer surface and defines the channel 81. At least some up to all of the modules 80 can include at least one of the connectors 68 that extends out from the body 82 of the module 80, such that the first end 68a of the connectors 68 surrounds the module outlet 84. As described above, the first ends 68a of the connectors 68 can be removably attached to the duct module bodies 82 as desired. As further described above, the connectors 68 can be flexible from the collapsed configuration to the expanded configuration whereby the second end 68b of the connector is spaced further out from the module 80 than when the connector is in its collapsed position.

Figure 6A:
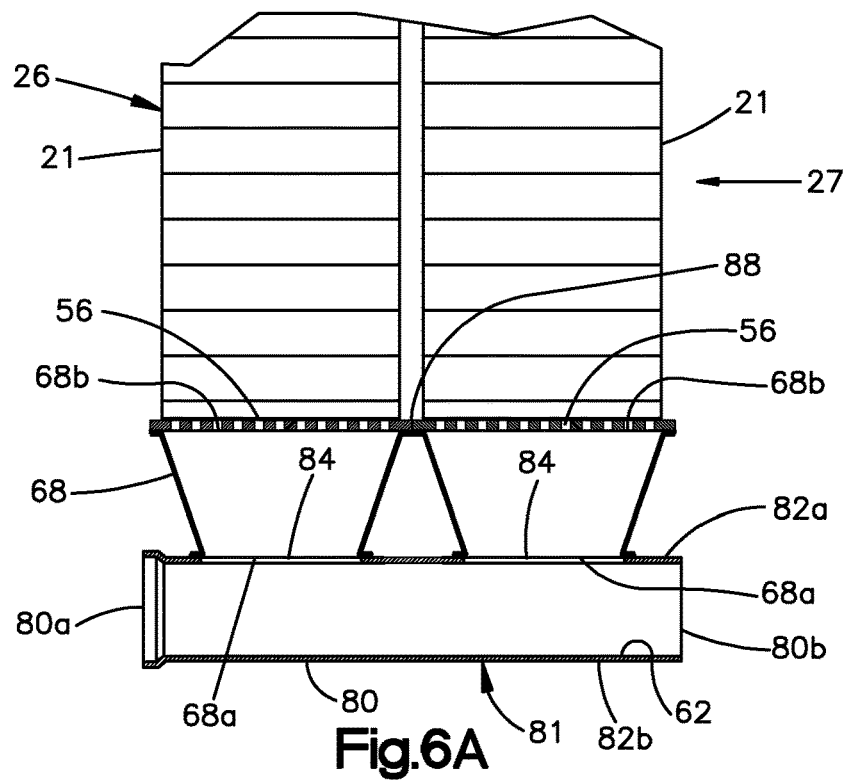
FIG. 6A is a sectional side elevation view of a portion of the data center illustrated in FIG. 1, showing an air distribution duct module constructed in accordance with an alternative embodiment.
Figure 6B:
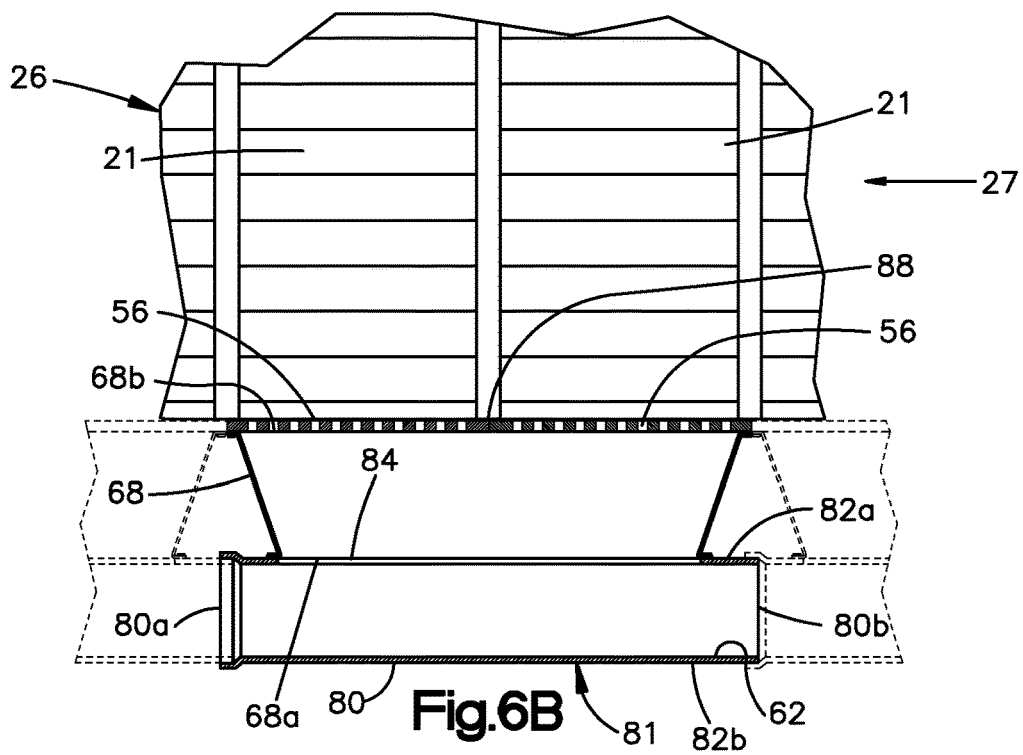
FIG. 6B is a sectional side elevation view of a portion of the data center illustrated in FIG. 1, showing an air distribution duct module constructed in accordance with another alternative embodiment.

Referring now to FIGS. 6A-6D, it should be appreciated that the modules 80 can be constructed in accordance with any suitable alternative embodiment as desired. As described above, the ducts 54 can include a plurality of connectors 68 that are each operably aligned with at least one of the racks 21 of the rack system 26. In one embodiment described above, the connectors 68 can each be operatively aligned with a single one of the racks 21. Alternatively, as illustrated in FIGS. 6A-B, at least one of the modules 80 can be operatively aligned with a plurality of racks 21 of a rack system 26.

As illustrated in FIG. 6A, at least one of the modules 80 can include a plurality of module outlets 84, each operatively aligned with a respective different one of the racks 21 of the rack system 26. Thus, the module outlets 84 of the at least one of the modules 80 can be spaced from each other along the longitudinal direction L. Accordingly, a first one of the module outlets 84 can be operatively aligned with a first one of the racks 21 of a rack systems 26, and a second one of the module outlets 84 can be operatively aligned with a second one of the racks 21 of the rack system 26 adjacent the first one of the racks 21 along the longitudinal direction L. The module 80 can include a pair of connectors that are attached to the module body 82 so as to deliver cold air 61 from the channel 81 to the cold air aisle 33 in the manner described above. As illustrated in FIG. 6B, at least one single one of the module outlets 84 can be operatively aligned with a plurality of racks 21 of a rack system 26. The plurality of racks 21 can be spaced from each other along the longitudinal direction L, and can be adjacent each other. The first end 68a of the connector 68 can be attached to the module body 82 so as to surround the module outlet 84 as described above. The second end 68b of the connector 68 can define a length in the longitudinal direction L sufficient so as to be placed in operative alignment with the plurality of racks 21, which can include first and second ones of the racks 21 of the rack system 26. It should be appreciated that a first one of the module outlets 84 (FIG. 6A) can have a first length in the longitudinal direction L, and a second one of the module outlets 84 (FIG. 6B) can have a second length in the longitudinal direction L greater than the first length.

Figure 7A:
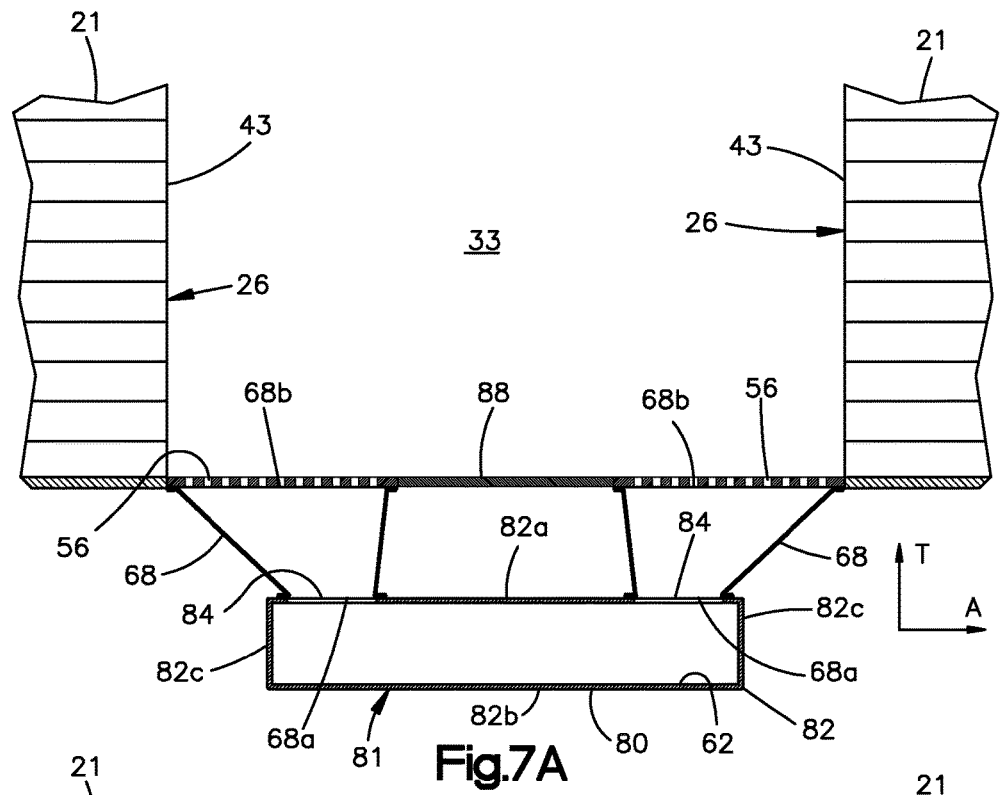
FIG. 7A is a sectional end elevation view of a portion of the data center illustrated in FIG. 1, showing an air distribution duct module constructed in accordance with still another alternative embodiment.
Figure 7B:
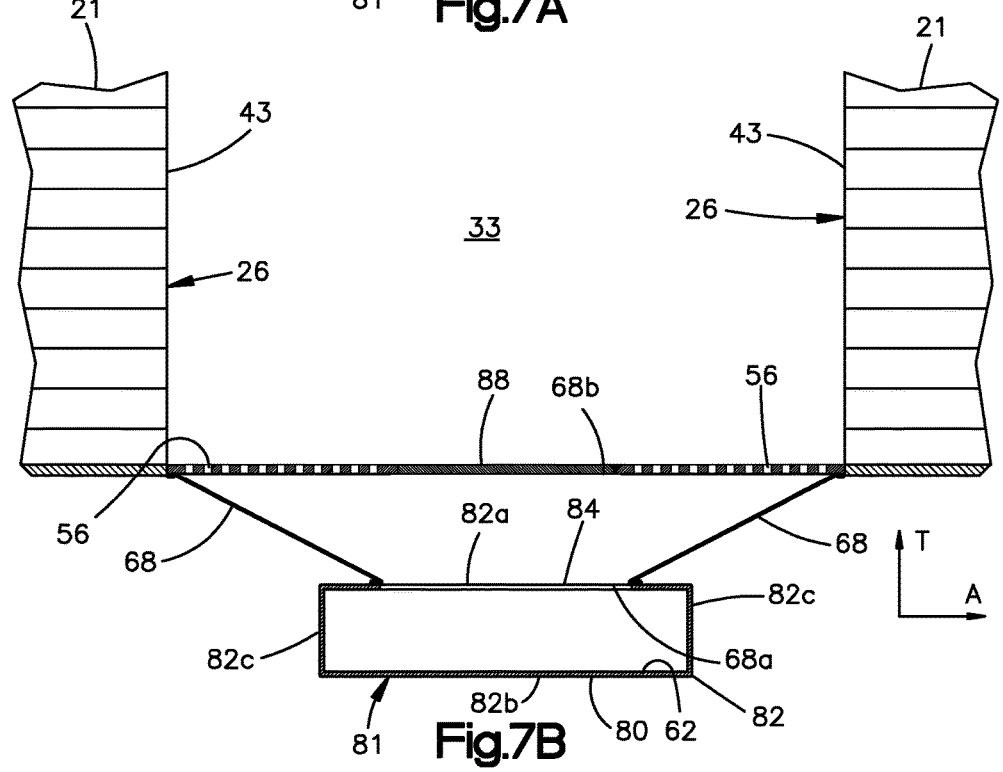
FIG. 7B is a sectional end elevation view of a portion of the data center illustrated in FIG. 1, showing an air distribution duct module constructed in accordance with another alternative embodiment.

Furthermore, as described above, the connectors 68 of one of the ducts 54 can be operatively aligned with at least respective one of the rack systems 26. In one embodiment, the connectors 68 of one of the ducts 54 can be operatively aligned with a single one of the rack systems 26. Alternatively, as illustrated in FIGS. 7A-B, at least one of the modules 80 can be operatively aligned with at least one rack 21 of a plurality of rack system 26. For instance, at least one of the modules 80 can be operatively aligned with at least one rack 21 of a first one of the rack systems 26 and at least one rack 21 of a second one of the rack systems 26. The first and second ones of the rack systems 26 can belong to one of the pairs 43 of rack systems 26 described above. Alternatively or additionally, the first and second ones of the rack systems 26 can belong to one of the pairs 41 of rack systems 26 (See FIG. 1).

As illustrated in FIG. 7A, at least one of the modules 80 can include a plurality of module outlets 84, each operatively aligned with at least one rack 21 of respective different ones of the rack system 26. Thus, the module outlets 84 of the at least one of the modules 80 can be spaced from each other along the lateral direction A. Accordingly, a first one of the module outlets 84 can be operatively aligned with at least one of the racks 21 of a first one of the rack systems 26, and a second one of the module outlets 84 can be operatively aligned with at least one rack of a second one of the rack system 26 spaced from the first one of the rack systems 26 along the lateral direction A. The module 80 can include first and second connectors 68 that are attached to the module body 82 so as to deliver cold air 61 from the channel 81 to the respective cold air aisle 33 in operative alignment with first and second ones of the rack systems 26, respectively. The first and second ones of the rack systems 26 can belong to one of the pairs 43, and thus share a common one of the cold air aisles 33. Accordingly, each of the pair of connectors can deliver cold air 61 to the common cold air aisle 33. Alternatively, the first and second ones of the rack systems 26 can belong to one of the pairs 41, and thus intake cold air 61 from different ones of the cold air aisles 33. Accordingly, a first one of the pair of connectors 68 can deliver cold air 61 to a first one of the cold air aisles 33, and a second one of the pair of connectors 68 can deliver cold air 61 to a second one of the cold air aisles 33.

As illustrated in FIG. 7B, at least one single one of the module outlets 84 can be operatively aligned with at least one rack 21 of a plurality of rack systems 26. The racks 21 of the plurality of rack systems 26 can be spaced from each other along the lateral direction A, and can be adjacent each other. The first end 68a of the connector 68 can be attached to the module body 82 so as to surround the module outlet 84 as described above. The second end 68b of the connector 68 can define a width in the lateral direction A sufficient so as to be placed in operative alignment with at least one rack 21 of each of the plurality of rack systems 26. The plurality of rack systems 26 can include first and second ones of the rack systems 26. The first and second ones of the rack systems 26 can belong to one of the pairs 43, and thus share a common one of the cold air aisles 33. Accordingly, the connector 84 can deliver cold air 61 to the common cold air aisle 33. Alternatively, the first and second ones of the rack systems 26 can belong to one of the pairs 41, and thus intake cold air 61 from different ones of the cold air aisles 33. It should be appreciated that a first one of the module outlets 84 (FIG. 7A) can have a first width in the lateral direction A, and a second one of the module outlets 84 (FIG. 7B) can have a second width in the lateral direction A greater than the first width.

It will be understood that at least one rack system 26, rack 21, and specified components thereof, that is operatively aligned with a given apparatus of the cooling system 50 can receive a greater volume of cold air 61 from that respective apparatus than any other rack system 26, rack 21, or specified components thereof. Further, the at least one rack system 26, rack 21, and specified components thereof that is operatively aligned with a given apparatus of the cooling system 50 can be disposed closer to that respective apparatus than any other rack system 26, rack 21, or specified components thereof. The operatively aligned apparatus can, for instance, include at least one up to all of the following: a respective at least one of the vents 56, a respective at least one of the ducts 54 and its components, a respective at least one of the air movers 52, and a respective at least one of the modules 80 and its components. It should further be appreciated that air can be said to be directed to operatively aligned rack systems, racks, or specified components thereof.

It should be appreciated that the modules 80 of the ducts 54 can be constructed identically with respect to each other. For instance, the first and second ends 80a and 80b of all of the modules 80 can be spaced apart from each other the same distance along the longitudinal direction L. Further, the sides 80c of all of the modules 80 can be spaced apart the same distance as each other along the lateral direction A. Further, the top 80a can be spaced from the bottom 80b of all of the modules 80 the same distance as each other along the transverse direction T. Further, the module outlets 84 can be spaced the same distance from the sides 80c, and the first and second ends 80a and 80b as each other, the duct outlets having the same dimensions as each other. Alternatively, at least one of the modules 80 of at least one of the ducts 54 can be constructed differently than others of the modules 80. For instance, one of the modules 80 can be devoid of the module outlet 84 and the corresponding connector 68. Furthermore, the module outlets 84 can have different cross-sectional dimensions from each other, such that the modules 80 whose module outlets 84 have smaller cross-sectional dimensions are disposed closer to the first end 54a of the duct than the modules 80 whose module outlets 84 have larger cross-sectional dimensions. Varying the cross-sectional dimensions of the module outlets 84 along the length of the duct 54 can provide for more uniform airflow through the module outlets 84 during operation. In another example, one or more of the duct modules 80 can be constructed as described in accordance with any embodiment herein, and one or more of the duct modules can be constructed as described in accordance with any other embodiment herein as desired.

Operation of the cooling system 50 will now be described with respect to FIGS. 2A-3B. In particular, the cooling system can include a heat removal unit 69 that is in fluid communication with at least one of the air movers 52. The cooling system 50 can include a plurality of heat removal units 69 that are each in fluid communication with a respective one of the air movers 52. Alternatively or additionally, at least one of the heat removal units 69 can be in fluid communication with more than one of the air movers 52. The heat removal units 69 can be configured as any suitably constructed computer room air handling unit that is configured to remove heat from the source air 64, and thus produce cold air 61 that is delivered to the at least one of the air movers 52. For instance, the heat removal unit 69 can be configured to receive the source air 64 from any suitable source, remove heat from the source air to produce cold air 61, and deliver the cold air 61 to an air mover intake 71 of the air mover 52. Thus, the method of operation can include the step of causing the source air 64 to flow from the plenum 76 to the heat removal unit 69 so as to produce the cold air 61. The air mover 52 is configured to direct the cold air 61 through the air mover outlet 72. The cold air 61 can be at any temperature suitable for cooling the computing devices 34. For instance, in one embodiment, the cold air 61 can be less than 100 degrees Fahrenheit, and above 40 degrees Fahrenheit, for instance between 60 and 90 degrees Fahrenheit, including approximately 75 degrees Fahrenheit.

The source can be an ambient environment 78 in which the data center 20 is disposed. Thus, the source air 64 can be configured as ambient air that is drawn from the ambient environment 78 external to the data center 20 and into the data center 20. In one embodiment, a first portion of the source air 64 can be configured as ambient air, and a second portion of the source air 64 can be configured as hot air 63 that is mixed with the ambient air to produce the source air 64. For instance, the cooling system 50 can include a plenum 76 that is configured to receive the ambient air and a portion of the hot air 63 from the hot air aisles 32 that are directed into the plenum. Thus, the cooling system 50 can include a plurality of conduits that are in fluid communication with the ambient environment 78 and respective inlets of the plenums 76. The ambient air and the hot air 63 are configured to mix inside the plenum 76 to define the source air 64 that flows from the plenum to the heat removal unit 69. Alternatively, the source air 64 can include only ambient air. Thus, an entirety of the hot air 63 can be expelled from the computing room 22. Alternatively still, the source air 64 can include only hot air 63 that is recirculated to the heat removal unit 69. For instance, it is envisioned that there may be instances in which the quality of the ambient air is undesirable for entrainment into the computing room 22. Thus, it should be appreciated that the cold air aisles 33 can be enclosed at their upper ends, so that they are in fluid communication only with the modular air distribution ducts 54 and the racks 21. In this embodiment, it should be appreciated that the hot air aisles 32 can be open in the computing room 22. The hot air 63 can travel to the heat removal unit 69 as source air 64. The heat removal unit 69 can remove heat from the source air 64 to produce cold air that travels to the air mover 52 as described above. The cooling system 50 can include a plurality of plenums 76 that are each in fluid communication with a respective one of the heat removal units 69, such that the source air 64 is directed from the plenums 76 to the respective heat removal units 69. Alternatively or additionally, at least one of the plenums 76 can be in fluid communication with more than one of the heat removal units 69.

The cold air 61 is directed under pressure induced by each of the air movers 52 to flow from the air mover outlet 72 through a respective at least one passageway 65 of the at least one duct 54 that is coupled to the air mover 52. Thus, the method of operation can include the step of causing the cold air 61 to flow from the heat removal unit 69, through the air mover 52, and into the passageway 65 of the modular air distribution duct 54. The cold air 61 flows along the passageway 65 and exits the passageway 65 through the respective ones of the duct outlets 66. The cold air 61 flows from the duct outlets 66, through the respective connectors 68 and through the floor 88, and into the respective cold air aisles 33 so as to be directed to corresponding operatively aligned computing devices 34 of at least one rack 21. Thus, the method of operation can include the step of causing the cold air 61 to flow from the passageway 65 through the plurality of connectors 86 that each have the first end 86a in fluid communication with the passageway 65, and the second end 86b in communication with at least one cold air aisle 33 at a location directed to different ones of the racks 21. As described above, the cold air 61 enters the cold air aisles 33 at a location between the lateral centers of the cold air aisles 33 and the operatively aligned racks 21 so as to direct cold air 61 to the operatively aligned racks 21. The cold air 61 flows through the intakes 39a of the computing devices 34 of the operatively aligned rack 21, flows over the electrical components 37 of the computing devices 34, and exits the computing devices 34 through the air outlets 39b into the hot air aisle 32 as hot air 63. Thus, the method of operation can include the step of causing the cold air 61 to flow from the at least one cold air aisle 33 through the computing devices 26 of each of the different ones of the racks 21 so as to exhaust the hot air 63 into at least one respective hot air aisle 32.

At least a portion up to an entirety of the hot air 63 can exit the data center 20 through the chimney 44. In one embodiment, the data center 20 can include a return conduit 74 that is in fluid communication with the hot air aisles 32, and thus the chimneys 44, and is further in fluid communication with the plenum 76. Thus, it can be said that the return conduit 74 is in fluid communication with the heat removal unit 69. As described above, the ambient air and at least a portion of the hot air 63 are configured to mix with each other in the plenum 76 so as to produce the source air 64 that flows into the heat removal unit 69 as described above. Thus, the plenum 76 can also be referred to as a mixing chamber.

A method of installing the cooling system 50 can include a number of steps that can be performed in any order as desired, unless otherwise specified. For instance, the method can include the step of attaching at least one plenum 76, such as a plurality of plenums 76, to respective ones of the heat removal units 69, such that each plenum 76 is in fluid communication with at least one heat removal unit 69. The method can further include the step of placing the heat removal unit 69 in fluid communication with the air mover 52. The method can further include the step of placing the plenum 76 in fluid communication with the return conduit 74 and the ambient environment 78. Next, the air distribution ducts 54 can be coupled between respective ones of the air movers 52 and respective ones of the cold air aisles 33, such that the air movers 52 are placed in fluid communication with respective ones of the air distribution ducts 54, and the air distribution ducts 54 are in fluid communication with respective ones of the cold air aisles 33. In particular, the first end 55a of the header 55 can be attached to the air mover, such that the first end 55 surrounds the air mover outlet 72 as described above. The first end 80a of a first one of the air distribution duct modules 80 can be attached to the second end 55b of the header 55 in the void 60, such that the air mover 52 is in fluid communication with the first one of the air distribution duct modules 80. The second end 68b of the at least one connector 68 that is attached to the body 82 of the first one of the modules 80 can be attached to the floor 88, such that the second end 68b is aligned with one of the cold air aisles 33 and in operative alignment with a first at least one of the racks 21 of at least one of the rack systems 26 as described above. The first end 80a of a second one of the air distribution duct modules 80 can be attached to the second end 80*b* of the first one of the air distribution duct modules 80 in the void 60, such that the air mover 52 is in fluid communication with the second one of the air distribution duct modules 80. The second end 68*b* of the at least one connector 68 that attached to the body 82 of the second one of the modules 80 can be attached to the floor 88, such that the second end 68*b* is aligned with one of the cold air aisles 33 and in operative alignment with a second at least one of the racks 21 of at least one of the rack systems 26 as described above. First ends 80*a* of additional duct modules 80 can be attached to second ends 80*b* of adjacent ones of the duct modules 80, and the respective connectors 68 can be attached to the floor so as to place the duct 54 in fluid communication with additional ones of the racks 21.

It should be noted that the illustrations and discussions of the embodiments shown in the figures are for exemplary purposes only, and should not be construed limiting the disclosure. One skilled in the art will appreciate that the present disclosure contemplates various embodiments. For instance, it should be appreciated that the computing room 22 can include any number of levels, greater than one, spaced from each other along the transverse direction T. Each of the levels can include a plurality of rack systems 26 supported on respective floors, whereby the floor of a second level can be porous and in fluid communication with the first level. As a result, cold air 61 can flow from the cold air aisle 33 of the first level, through the floor of the second level, and into a cold air aisle of the second level. Additionally, it should be understood that the concepts described above with the above-described embodiments may be employed alone or in combination with any of the other embodiments described above. It should further be appreciated that the various alternative embodiments described above with respect to one illustrated embodiment can apply to all embodiments as described herein, unless otherwise indicated.

What is claimed:

1. A data center comprising:
  a computing room;
  a plurality of rows of rack systems each disposed in the computing room, at least some of the rack systems of the plurality of rows of rack systems including a plurality of racks that each include a respective rack housing and computing devices supported by the rack housing, the plurality of rows of rack systems spaced from each other along a lateral direction such that each of the plurality of rows of rack systems is disposed between a respective hot air aisle of a plurality of hot air aisles and a cold air aisle of a plurality of cold air aisles;
  a cooling system including:
    a heat removal unit configured to receive source air and remove heat from the source air so as to produce cold air;
    an air mover in fluid communication with the heat removal unit so as to receive the cold air from the heat removal unit;
    a modular air distribution duct elongate along a longitudinal direction perpendicular to the lateral direction, the modular air distribution duct in fluid communication with the air mover so as to receive the cold air from the air mover, the modular air distribution duct including a plurality of removably interconnected air distribution duct modules that combine so as to define a passageway of the modular air distribution duct, the removably interconnected air distribution duct modules including a connector having a first end in fluid communication with the passageway, and a second end in operative alignment with at least one respective rack of the racks of one of the rack systems, the second end of the connector being coupled to a floor at a location offset from the at least one respective rack in the lateral direction, and the connector extending perpendicular to the modular air distribution duct;
  wherein the cold air passes from the passageway through the connectors to a respective at least one of the plurality of cold air aisles and through the computing devices of the respective different ones of the racks, such that the computing devices transfer heat to the cold air to produce hot air, and at least a portion of the hot air is exhausted into a respective at least one of the hot air aisles.

2. The data center as recited in claim 1, further comprising a return conduit in fluid communication with the respective at least one of the hot air aisles, wherein the cooling system further comprises a plenum configured to receive ambient air and further configured to receive a portion of the hot air from the return conduit, such that the received ambient air and the received hot air mix in the plenum so as to produce the source air.

3. The data center as recited in claim 1, wherein the floor is disposed between the modular air distribution duct and the at least one of the cold air aisle, wherein at least a portion of the floor is porous, and the second end of the connector is supported by the floor such that the cold air travels from the second end of the connector, through the floor, and into the cold air aisle.

4. The data center as recited in claim 1, wherein the second end of the connectors are offset from a center of the respective one of the cold air aisles along the lateral direction toward the one of the rack systems.

5. The data center as recited in claim 1, wherein the connectors are flexible from a collapsed configuration whereby the second end is spaced from the passageway a first distance and an expanded configuration whereby the second end is spaced from the passageway a second distance greater than the first distance.

6. A data center comprising:
  a computing room;
  a plurality of racks disposed in the computing room between hot air aisles and cold air aisles, each of the racks including a rack housing and a plurality of computing devices supported by the rack housing; and
  a cooling system including an air mover and a plurality of air distribution duct modules attached to each other so as to define a modular air distribution duct having a passageway in fluid communication with the air mover, wherein the modular air distribution duct further includes a plurality of connectors each having first ends in fluid communication with the passageway, and second ends that are aligned with at least one of the cold air aisles so as to direct air into respective operatively aligned different ones of the racks, the second ends of the connectors each are coupled to a floor at a location offset from at least one respective rack in the lateral direction, and the plurality of connectors each extending perpendicular to the modular air distribution duct, wherein each of the air distribution duct modules includes at least one of the connectors,
  wherein the air mover is configured to direct cold air into the modular air distribution duct such that the cold air passes from the passageway, through at least one of the plurality of connectors, and into the at least one of the cold air aisles toward the operatively aligned different ones of the racks, such that the cold air passes through computing devices of the operatively aligned different ones of the racks from the at least one of the cold air aisles, such that the computing devices transfer heat to the cold air so as to produce hot air.

7. The data center as recited in claim 6, wherein the cooling system comprises a heat removal unit configured to receive source air and remove heat from the source air so as to produce the cold air that is delivered to the air mover.

8. The data center as recited in claim 7, wherein at least a portion of the hot air is exhausted from the computing devices of the operatively aligned different ones of the racks into at least one of the hot air aisles.

9. The data center as recited in claim 8, further comprising return conduit in fluid communication with the at least one of the hot air aisles, wherein the cooling system further comprises a plenum in fluid communication with the air mover, the plenum configured to receive ambient air and further configured to receive a portion of the hot air from the return conduit, and the portion of the hot air mixes with the ambient air in the plenum so as to produce the source air.

10. The date center as recited in claim 6, wherein the connectors are flexible between a collapsed configuration whereby the second ends are spaced from the passageway a first distance, and an expanded configuration whereby the second ends are spaced from the passageway a second distance greater than the first distance.

11. The data center as recited in claim 6, wherein the floor is disposed between the modular air distribution duct and the computing room, wherein the second ends of the connectors are aligned with porous regions of the floor.

12. The data center as recited in claim 11, wherein the floor defines a plurality of porous vents, and the second ends of the connectors are aligned with different ones of the porous vents.

13. The data center as recited in claim 6, wherein the air distribution duct defines a first end in fluid communication with the air mover, and a second closed end opposite the first end and spaced from the first end along a longitudinal direction, and the first ends of the connectors are equidistantly spaced along the longitudinal direction.

14. The data center as recited in claim 6, wherein the air distribution duct defines a first end in fluid communication with the air mover, and a second closed end opposite the first end and spaced from the first end along a longitudinal direction, and the first ends of the connectors are variably spaced along the longitudinal direction.

15. The data center as recited in claim 6, wherein the at least one of the connectors of at least one of the air distribution duct modules is operatively aligned with more than one rack.

16. The data center as recited in claim 6, further comprising:
 a plurality of rack systems that each includes a plurality of the racks aligned along a row, each of the rack systems disposed between a respective one of the hot air aisle and a respective one of the cold air aisles,
 wherein at least one of the connectors of at least one of the air distribution duct modules is operatively aligned with first and second ones of the rack systems.

17. The data center as recited in claim 16, wherein the computing devices of the first and second ones of the rack systems receive cold air from a common one of the cold air aisles.

18. The data center as recited in claim 16, wherein the computing devices of the first and second ones of the rack systems exhaust hot air into a common one of the hot air aisles.

19. The data center as recited in claim 6, wherein at least one of the air distribution duct modules is devoid of a connector.

* * * * *